(12) United States Patent
Chen et al.

(10) Patent No.: US 7,709,374 B2
(45) Date of Patent: May 4, 2010

(54) FABRICATION METHOD FOR MEMORY DEVICE

(75) Inventors: Wen-Hsiang Chen, Taoyuan County (TW); Hsin-Yu Hsiao, Taoyuan County (TW)

(73) Assignee: Inotera Memories, Inc., Taoyuan (TW)

( * ) Notice: Subject to any disclaimer, the term of this patent is extended or adjusted under 35 U.S.C. 154(b) by 0 days.

(21) Appl. No.: 12/179,379

(22) Filed: Jul. 24, 2008

(65) Prior Publication Data
US 2009/0209100 A1   Aug. 20, 2009

(30) Foreign Application Priority Data
Feb. 18, 2008   (TW) .............................. 97105602 A

(51) Int. Cl.
*H01L 21/44* (2006.01)
*H01L 21/4763* (2006.01)

(52) U.S. Cl. ........................ 438/637; 438/643; 438/677; 257/E21.577

(58) Field of Classification Search .................. 438/675, 438/677, 597, 618, 642, 643, 637; 257/E21.235, 257/E21.577, E21.585
See application file for complete search history.

(56) References Cited

U.S. PATENT DOCUMENTS

| 6,677,247 | B2 * | 1/2004 | Yuan et al. ................... 438/723 |
| 2006/0148227 | A1 * | 7/2006 | Kronke et al. ............... 438/586 |
| 2008/0145797 | A1 * | 6/2008 | Verbeke et al. .............. 430/322 |

* cited by examiner

*Primary Examiner*—Tuan N. Quach
(74) *Attorney, Agent, or Firm*—Quintero Law Office

(57) ABSTRACT

The invention provides a method for fabricating a memory device. At first, a substrate having a plurality of gate electrode stacks and a source/drain region is provided, and a barrier layer and a sacrificial layer are sequentially formed on the substrate and cover the gate electrode stacks. A portion of the sacrificial layer is removed to form a sacrificial plug between the gate electrode stacks, and then a filling layer is formed over the substrate. Next, the sacrificial plug is removed, and a contact hole is formed. A clean step with a solution containing ammonia is carried out. The barrier layer at the bottom of the contact hole is removed, and a metal plug is then formed in the contact hole to electrically contact with the source/drain region.

11 Claims, 6 Drawing Sheets

FABRICATION METHOD FOR MEMORY DEVICE

CROSS REFERENCE TO RELATED APPLICATIONS

This Application claims priority of Taiwan Patent Application No. 097105602, filed on Feb. 18, 2008, the entirety of which is incorporated by reference herein.

BACKGROUND OF THE INVENTION

1. Field of the Invention

The invention relates to a fabrication method for memory devices, and more particularly to a method for fabricating a bit line contact of a memory device.

2. Description of the Related Art

Currently, the bit line contact is fabricated by a self-aligned process during the fabrication of a dynamic random access memory (DRAM). At first, the insulating layer and the sacrificial layer are formed on the substrate, followed by patterning by a photolithography/etching process to define the area where the bit line contact is to be later formed. Next, the sacrificial layer and the insulating layer are removed, and the contact hole is formed. The metal plug is then filled in the contact hole to complete fabrication of the bit line contact.

FIG. 1 is a cross section of an unfinished memory device fabricated by a conventional method. Referring to FIG. 1, the gate electrode stacks 2 are formed on the substrate 1, and therebetween, the doped region 3 is formed in the substrate 1. In FIG. 1, the boron phosphate silicon glass (BPSG) layer 4 is formed over the substrate 1, followed by removal of the polysilicon sacrificial layer 5 to form the contact hole 7. When the sacrificial layer 5 is being removed, the etching rate of the polysilicon sacrificial layer of the peripheral substrate is smaller than the etching rate of the polysilicon sacrificial layer of the central substrate. As a result, the polysilicon sacrificial layer 5 of the peripheral substrate remains at the bottom of the contact hole 7. Since the polysilicon sacrificial layer 5 remains at the bottom of the contact hole 7, the silicon oxide layer 6 at the bottom of the contact hole 7 can not be completely removed. Accordingly, the metal plug later formed can not be completely in contact with the doped region 3, resulting in bit line contact failure.

Thus, a fabrication method for memory devices eliminating the described problems is required.

BRIEF SUMMARY OF INVENTION

Accordingly, the invention provides a method for fabricating a memory device. An exemplary embodiment of the method includes: providing a substrate having a plurality of gate electrode stacks formed thereon and a doped region formed therein between the gate electrode stacks; depositing a barrier layer on the substrate and the gate electrode stacks; forming a sacrificial layer over the substrate; removing a portion of the sacrificial layer to form a sacrificial plug between the gate electrode stacks; forming a filling layer over the substrate; removing the sacrificial plug to form a contact hole; performing a clean step with a solution containing ammonia; removing the barrier layer in the bottom of the contact hole to expose the doped region; and forming a metal plug in the contact hole to contact with the doped region.

Since the residual sacrificial plug can be completely removed by the clean step with the ammonia solution, there are no remaining elements of the sacrificial plug and the barrier layer at the bottom of the contact hole. Thus, the metal plug can be completely in contact with the doped region, thereby eliminating bit line contact failure.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the exemplary embodiments of carrying out the invention. This description is made for the purpose of illustrating the general principles of the invention and should not be taken in a limiting sense. The scope of the invention is best determined by reference to the appended claims.

The invention will be described in an exemplary embodiment of fabricating a memory device. However, the invention may also be applied to making other semiconductor devices requiring cleaning steps.

Figure 1:
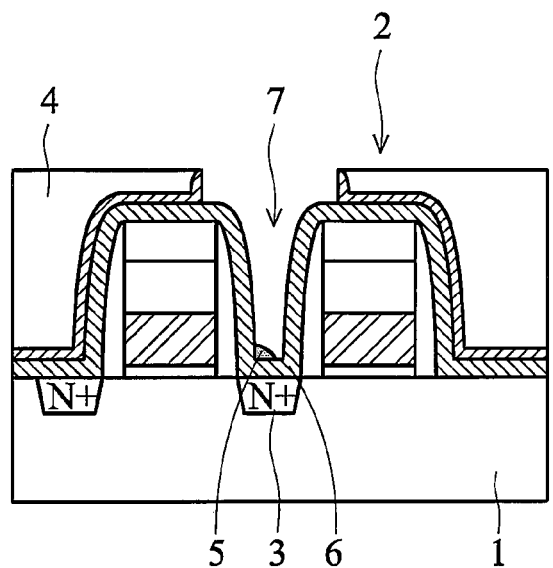
FIG. 1 is a cross section of an unfinished memory device fabricated by a conventional method.
Figure 2:
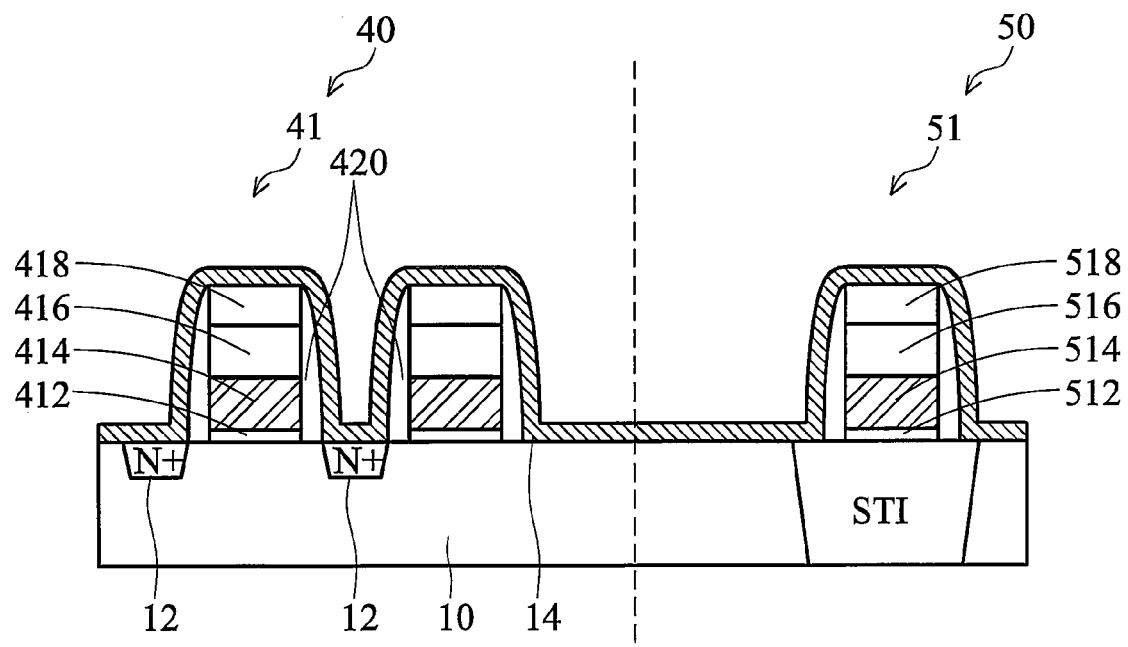
FIGS. 2-9 are schematic views illustrating a method for fabricating a memory device according to an embodiment of the invention.

FIGS. 2 through 9 are schematic views illustrating a method for fabricating a bit line contact of a memory device according to an embodiment of the invention. Referring to FIG. 2, a substrate 10, which is divided into a cell array region 40 and a logic region 50, is provided with a plurality of gate electrode stacks 41 and 51 formed thereon. A doped region, such as a source/drain region 12, is formed in the substrate 10 between the gate electrode stacks 41, and a shallow trench isolation (STI) region is located in the substrate 10 beneath the gate electrode stack 51. Preferably, the substrate 10 is made of a semiconductor material such as silicon, and the substrate 10 may be referred to as a silicon wafer.

In FIG. 2, the gate electrode stacks 41 and 51 are disposed on the gate insulation layers 412 and 512, and respectively include the gate electrode layers 414 and 514 made of a material such as polysilicon, and the contact layers 416 and 516 made of a material such as tungsten (W), tungsten nitride (WN) or tungsten silicide (WSi). The covering layers 418 and 518 made of a material such as silicon oxide are disposed on the gate electrode stacks 41 and 51 to avoid damage caused by following processes. The gate spacers 420 and 520 made of a material such as silicon oxide are formed on the sidewalls of the gate electrode stacks 41 and 51.

Figure 3:
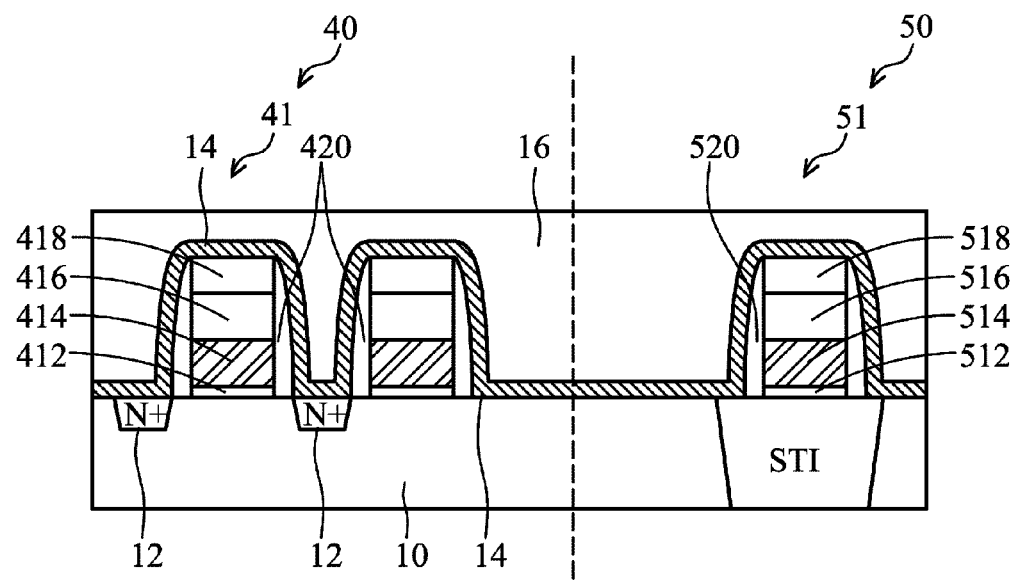

Referring to FIG. 3, a barrier layer 14 is conformally formed on the substrate 10 and the gate electrode stacks 41 and 51, and covers the source/drain region 12. Preferably, the barrier layer 14 is made of silicon oxide, and is formed by a plasma enhanced chemical vapor deposition (PECVD), low pressure chemical vapor deposition (LPCVD) or atomic layer deposition (ALD) process.

Next, a sacrificial layer 16 is formed over the substrate 10 and covers the above elements on the substrate 10. Preferably, the sacrificial layer 16 is an undoped polysilicon layer and is formed by a PECVD, LPCVD or ALD process.

Figure 4:
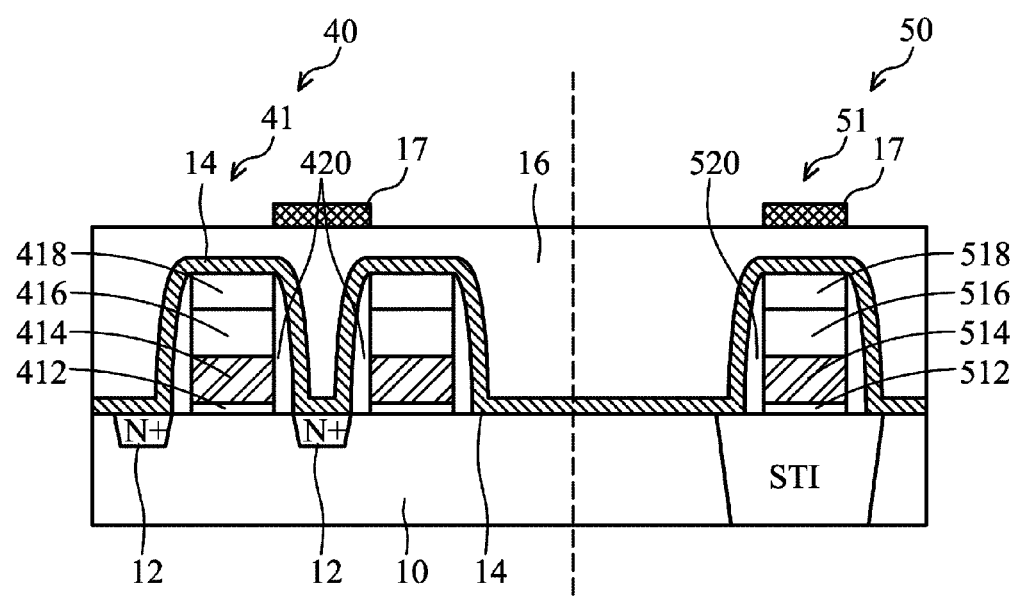

Referring to FIG. 4, a hard mask layer 17 is formed on the sacrificial layer 16 and is located at a place where a bit line contact will be formed later. For example, a silicon nitride layer is deposited on the sacrificial layer 16 and then patterned by photolithography/etching to form the hard mask layer 17. Note that an antireflection layer (not shown) may be utilized to prevent the interface between the silicon nitride layer and the photoresist (not shown) from reflection during exposure before the silicon nitride layer is formed.

Figure 5:
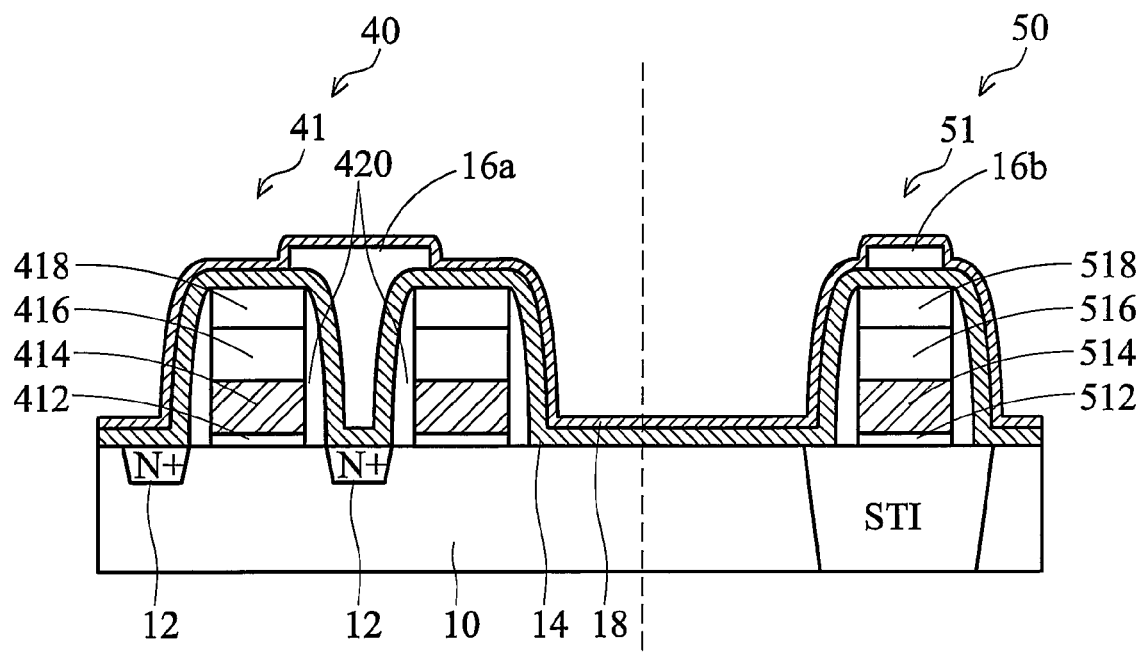

Next, the hard mask layer 17 is used as a mask while an anisotropic etching step such as a dry-etching process is carried out to remove a portion of the sacrificial layer 16 uncovered by the hard mask layer 17. After the portion of the sacrificial layer 16 has been removed, the hard mask layer 17 is removed by a wet-etching process to form sacrificial plugs 16a and 16b. As shown in FIG. 5, the sacrificial layer 16a is disposed at an area of the unit cell region 40 where the bit line contact will be later formed, and the sacrificial layer 16b is disposed at an area of the logic region 50 where the gate electrode contact will be later formed.

In FIG. 5, a diffusion layer 18 made of a material such as silicon nitride or silicon oxynitirde, is conformally formed on the substrate 10, the gate electrode stacks 41 and 51, and the sacrificial plugs 16a and 16b by a chemical vapor deposition (CVD) process.

Figure 6:
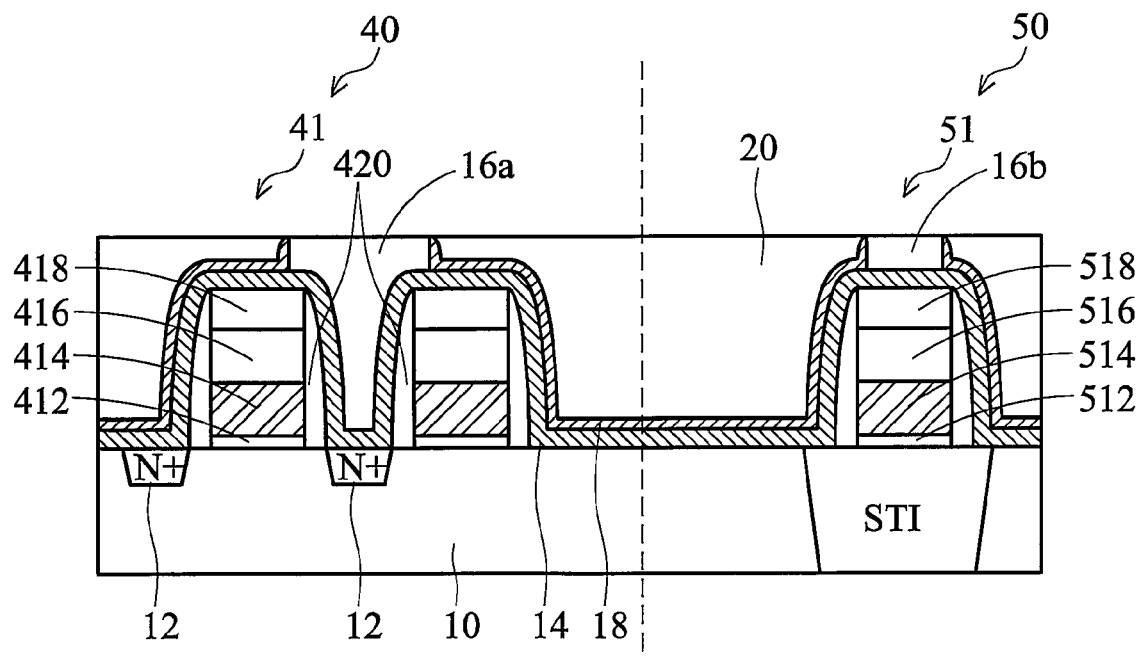

Referring to FIG. 6 a filling layer 20 is formed over the substrate 10. Preferably, the filling layer 20 is made of a material such as boron phosphate silicon glass (BPSG) and is deposited over the substrate 10 by a LPCVD process. Next, a thermal treatment is performed, the filling layer 20 reflows to make the filling layer 20 fill up the spaces between the gate electrodes stacks 41 and 51. Accordingly, the filing layer 20 can be densified.

In FIG. 6, after the densification step, a planarization step is carried out. Preferably, the filling layer 20 is flattened by a chemical mechanical polishing (CMP) process to grind the filling layer 20 until the tops of the sacrificial plugs 16a and 16b are exposed. In some embodiments, an ammonia sign may act as a polishing stop point. For example, the diffusion barrier 18 made of silicon nitride may act as a polishing stop layer when the chemical mechanical polishing process is performed on the diffusion barrier layer 18. An ammonia sign would occur to stop the chemical mechanical polishing process. Then, a portion of the diffusion barrier layer 18 would be removed to expose the tops of the sacrificial plugs 16a and 16b.

Figure 7:
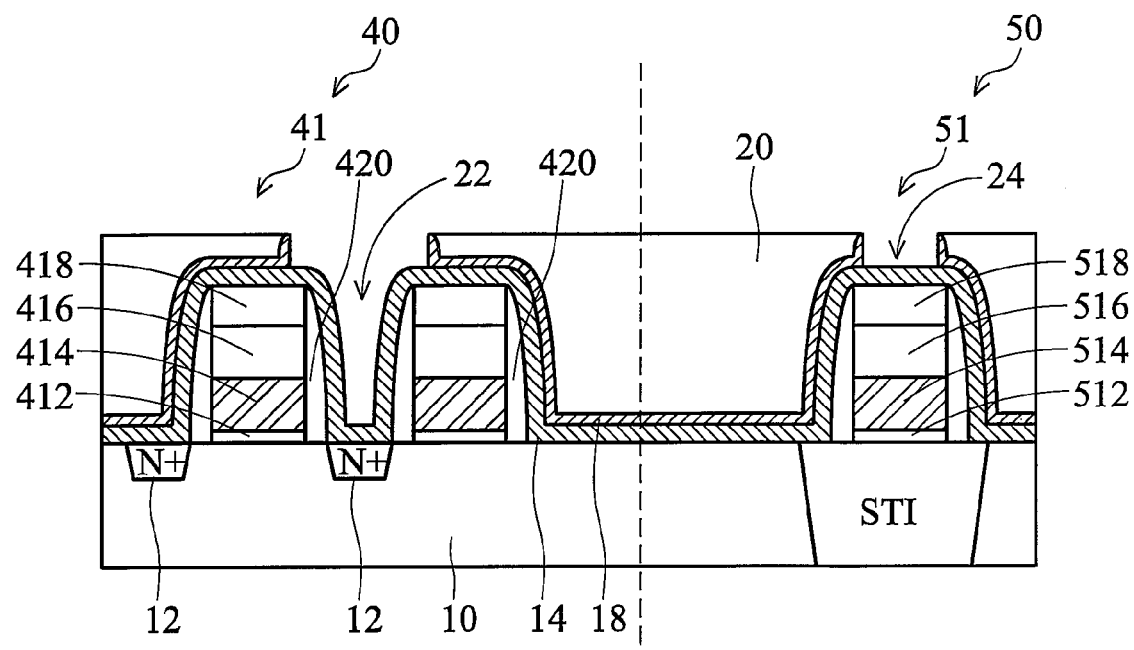

Referring to FIG. 7, the sacrificial plugs 16a and 16b are removed to form the contact holes 22 and 24. Preferably, the sacrificial plug 16a between the gate electrode stacks 41 and the sacrificial plug 16b on the gate electrode stack 51 are removed by a plasma etching process.

Figure 8:
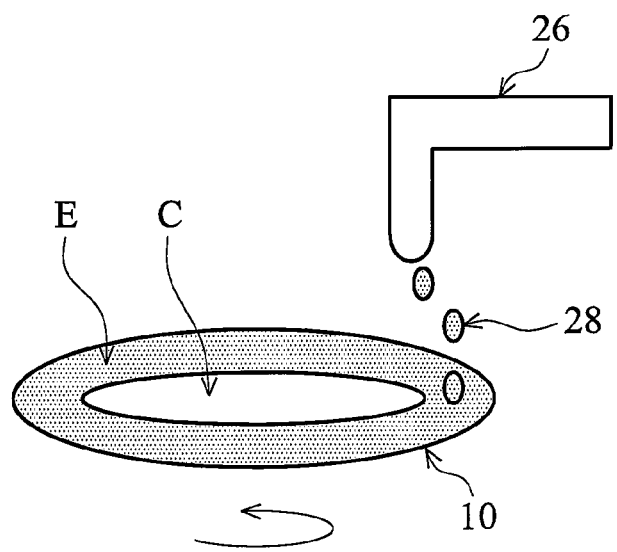

After the sacrificial plugs 16a and 16b are removed, a cleaning step with the ammonia solution is carried out. FIG. 8 is a schematic view illustrating a single wafer clean tool produced by the SEZ Group. Referring to FIG. 8, a nozzle 26 supplies a washing solution 28 containing ammonia (NH$_4$OH) to a desirable area of the substrate 10 or the wafer to wash and remove the residual sacrificial plugs 16a and 16b. The substrate 10 is spun during the cleaning step to remove the washing solution 28.

When the etching step for removing the sacrificial plugs 16a and 16b is being carried out, the etching rate of the sacrificial plugs 16a and 16b of the peripheral substrate 10 is smaller than the etching rate of the sacrificial plugs 16a and 16b of the central substrate 10. As a result, the sacrificial plugs 16a and 16b of the peripheral substrate 10 may not be completely removed, and the residual sacrificial plug 16a at the cell array region 40 may cause bit line contact failure because the metal plug that is later formed will not completely contact with the source/drain region 12. By using the cleaning step of the exemplary embodiment of the invention with ammonia solution, the substrate 10 may be locally washed and the residual sacrificial plugs 16a and 16b may be further removed to avoid bit line contact failure. Moreover, in an exemplary embodiment of the sacrificial layer made of undoped polysilicon, the etching selectivity of ammonia solution to polysilicon is larger than silicon oxide, thus, damage to the barrier layer 14 and the spacers 420 and 520 will not occur during the cleaning step with the ammonia solution.

Note that the nozzle 26 as shown in FIG. 8 may be moved to anywhere over the substrate 10, such as the center C of the substrate 10 or the edge E of the substrate 10, to carry out the clean step with ammonia solution. Accordingly, the substrate 10 can be selectively and locally cleaned.

Figure 9:
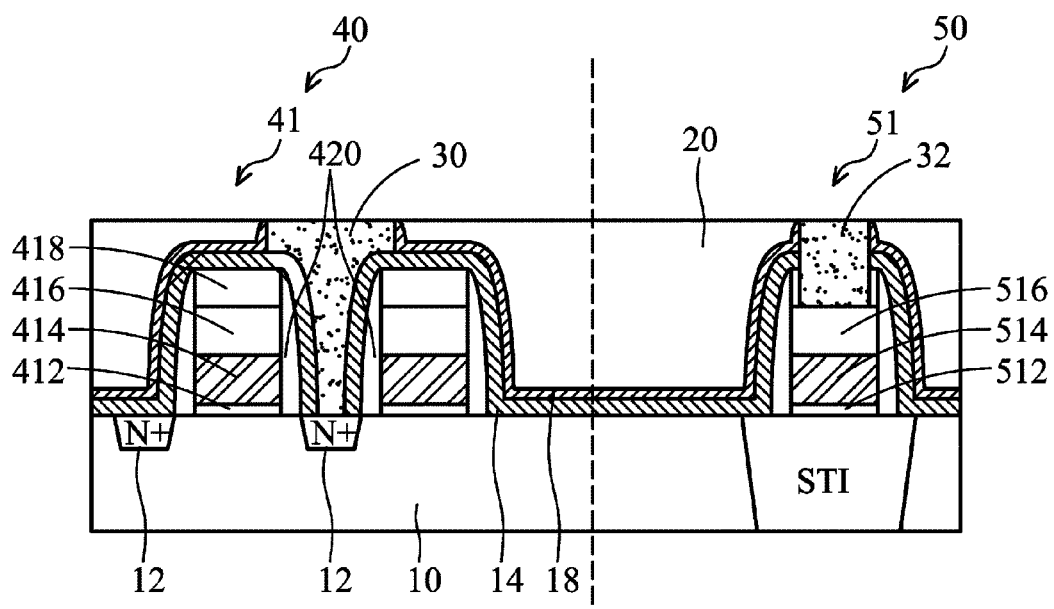

Referring to FIG. 9, after the clean step with ammonia solution is carried out, the barrier layer 14 at the bottom of the contact hole 22, and the barrier layer 14 and the covering layer 518 exposed by the contact hole 24 are removed by an anisotropic etching step such as a dry-etching process to expose the source/drain region 12 and the contact layer 516. Because of the clean step with the ammonia solution, no sacrificial plugs made of polysilicon remain in the contact holes, so that the barrier layer can be completely removed and no residual barrier layer exits in the contact holes.

Next, a metal plug 30, also referred to as a bit line contact, and a metal plug 32, also referred to as a gate electrode contact, are respectively formed in the contact holes 22 and 24 to electrically connect to or contact with the source/drain region 12 and the contact layer 516. In one embodiment, a metal layer such as tungsten (W) is deposited on the substrate 10 by a CVD process. A portion of the metal layer is then removed by a CMP process to form the metal plugs 30 and 32. Note that since no sacrificial plugs and barrier layer remain in the contact hole, the metal plugs can be completely in contact with the source/drain region, thereby avoiding bit line contact failure.

Figure 10:
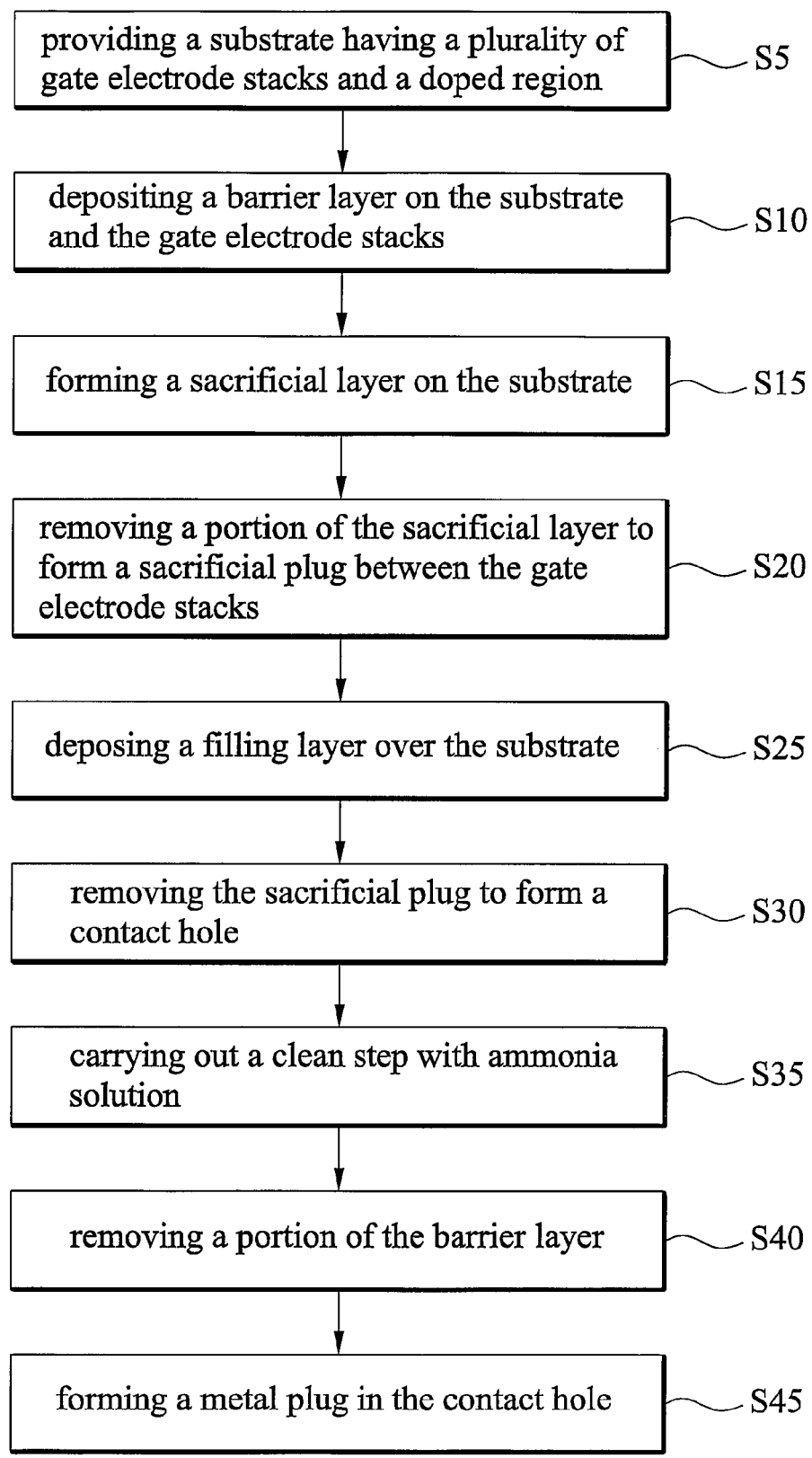
FIG. 10 is a flowchart of a method for fabricating a memory device according to an embodiment of the invention.

FIG. 10 is a flowchart of a method for fabricating a bit line contact of a memory device according to an embodiment of the invention. At first, a substrate having a plurality of gate electrode stacks and a doped region is provided, as shown in step S5. A barrier layer is deposited on the substrate and the gate electrode stacks, as shown in step S10. A sacrificial layer is formed over the substrate and covers the barrier layer and the gate electrode stacks, as shown in step S15. Next, a portion of the sacrificial layer is removed, and a sacrificial plug is then formed, as shown in step S20. A filling layer is deposited over the substrate and the sacrificial plug is then removed to form a contact hole, as shown in steps S25 and S30. A clean step with ammonia solution is carried out, as shown in step S35. After the clean step, a portion of the barrier layer is removed, as shown in step S40. A metal plug is formed in the contact hole to contact with the doped region, as shown in step S45.

Since the residual sacrificial plug is completely removed by the clean step with ammonia solution, no sacrificial layer and barrier layer remain in the contact hole. Thus, the metal plug can be completely in contact with the doped region.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a memory device, comprising:
providing a substrate having a plurality of gate electrode stacks formed thereon and a doped region formed in the substrate between the gate electrode stacks;
depositing a barrier layer on the substrate and the gate electrode stacks;
forming a polysilicon sacrificial layer over the barrier layer;
removing a portion of the polysilicon sacrificial layer to form a polysilicon sacrificial plug between the gate electrode stacks;
forming a filling layer over the substrate between the gate electrode stacks;
removing the polysilicon sacrificial plug to form a contact hole;
performing a cleaning step with a solution containing ammonia for further removing the residue of the removed polysilicon sacrificial plug remained in the contact hole;
removing a portion of the barrier layer to expose the doped region; and
forming a metal plug in the contact hole to contact with the doped region.

2. The method as claimed in claim 1, wherein the barrier layer is formed by a plasma enhanced chemical vapor deposition, low pressure chemical vapor deposition or atomic layer deposition process.

3. The method as claimed in claim 1, wherein the polysilicon sacrificial layer is formed by a plasma enhanced chemical vapor deposition, low pressure chemical vapor deposition or atomic layer deposition process.

4. The method as claimed in claim 1, wherein forming the polysilicon sacrificial plug comprises:
forming a hard mask layer on the polysilicon sacrificial layer; and
removing the portion of the polysilicon sacrificial layer;
removing the hard mask layer.

5. The method as claimed in claim 1, wherein the polysilicon sacrificial layer is removed by an anisotropic etching process.

6. The method as claimed in claim 1, wherein after the polysilicon sacrificial plug is removed, the method further comprises forming a diffusion barrier layer over the substrate.

7. The method as claimed in claim 1, wherein the filling layer is formed by a low pressure chemical vapor deposition process.

8. The method as claimed in claim 1, wherein after the filling layer is formed, the method further comprises performing a densification step.

9. The method as claimed in claim 1, wherein after the filling layer is formed, the further comprises performing a planarization step.

10. The method as claimed in claim 9, wherein the filling layer is flattened by a chemical mechanical polishing process.

11. The method as claimed in claim 1, wherein the cleaning step with the solution containing ammonia is performed by a single wafer clean tool.

* * * * *